US012808081B2

(12) United States Patent
Choi

(10) Patent No.: US 12,808,081 B2
(45) Date of Patent: Nov. 24, 2026

(54) METHOD OF PHASE-TRANSITIONING THREE-DIMENSIONAL DIRAC SEMIMETAL INTO TWO-DIMENSIONAL WEYL SEMIMETAL AND SEMIMETAL THAT UNDERGOES PHASE TRANSITION BY THE SAME

(71) Applicant: UNIVERSITY-INDUSTRY COOPERATION GROUP OF KYUNG HEE UNIVERSITY, Yongin-si (KR)

(72) Inventor: Suk Ho Choi, Suwon-si (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 442 days.

(21) Appl. No.: 18/405,493

(22) Filed: Jan. 5, 2024

(65) Prior Publication Data

US 2024/0392472 A1 Nov. 28, 2024

(30) Foreign Application Priority Data

May 25, 2023 (KR) ........................ 10-2023-0067711
Nov. 29, 2023 (KR) ........................ 10-2023-0169525

(51) Int. Cl.
*C30B 25/18* (2006.01)
*C22C 12/00* (2006.01)
*C30B 29/10* (2006.01)

(52) U.S. Cl.
CPC ............ *C30B 25/183* (2013.01); *C22C 12/00* (2013.01); *C30B 29/10* (2013.01)

(58) Field of Classification Search
CPC ..... C30B 25/183; C30B 29/10; C30B 23/025; C22C 12/00
See application file for complete search history.

(56) References Cited

U.S. PATENT DOCUMENTS

2007/0235653 A1* 10/2007 Buckle .................... C30B 29/48 117/106
2019/0139760 A1* 5/2019 Fuhrer ................ H10P 14/2905
2022/0223365 A1* 7/2022 Choi ................. H01J 37/32412
(Continued)

FOREIGN PATENT DOCUMENTS

KR 102364726 B1 * 2/2022 ............. H10P 30/20

OTHER PUBLICATIONS

Office Action dated Sep. 11, 2024 received in Korean Application No. 10-2023-169525.
(Continued)

*Primary Examiner* — S M Sohel Imtiaz
(74) *Attorney, Agent, or Firm* — USX IP LLC

(57) ABSTRACT

The present disclosure relates to a method of phase-transitioning a three-dimensional Dirac semimetal into a two-dimensional Weyl semimetal and a semimetal that undergoes a phase transition by the same. The Dirac semimetal according to one embodiment may be any one semimetal of a bismuth-antimony-based semimetal, a sodium-bismuth-based semimetal, and a cadmium-arsenic-based semimetal, and may be formed on a substrate to have a thickness of 2 nm to 10 nm so that a phase transition to a Weyl semimetal is induced.

9 Claims, 11 Drawing Sheets

(56) References Cited

U.S. PATENT DOCUMENTS

| | | | | |
|---|---|---|---|---|
| 2023/0238328 A1* | 7/2023 | Alberi | H10F 77/1696 | 257/613 |
| 2023/0326857 A1* | 10/2023 | Lu | H10W 20/072 | 257/152 |
| 2024/0276888 A1* | 8/2024 | Molinari | H10N 50/10 | |

OTHER PUBLICATIONS

Sadek et al., "Structural and Electrical Characterizations of BiSb topological Insulator Layers Expitaxially Integrated on GaAs", American Chemical Society 2022, Chrystal Growth & Design, pp. 5081-5091; https://doi.org/10.1021/acs.cgd.2c00585.

* cited by examiner

【FIG. 1A】
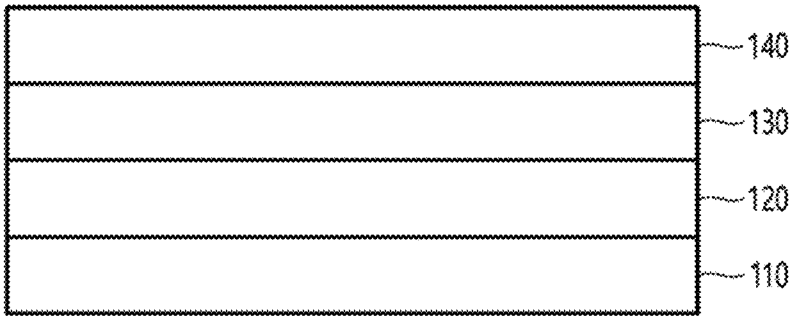
【FIG. 1B】
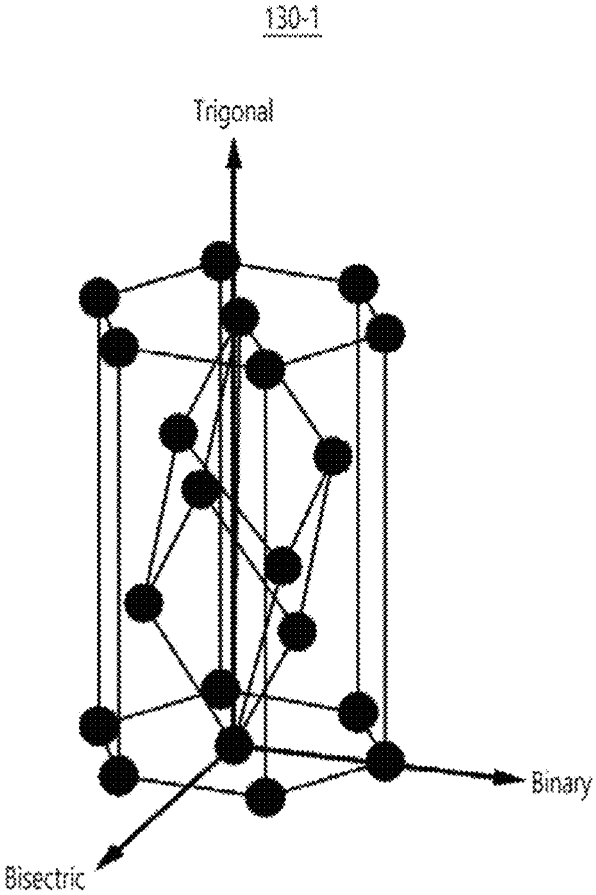

【FIG. 2】
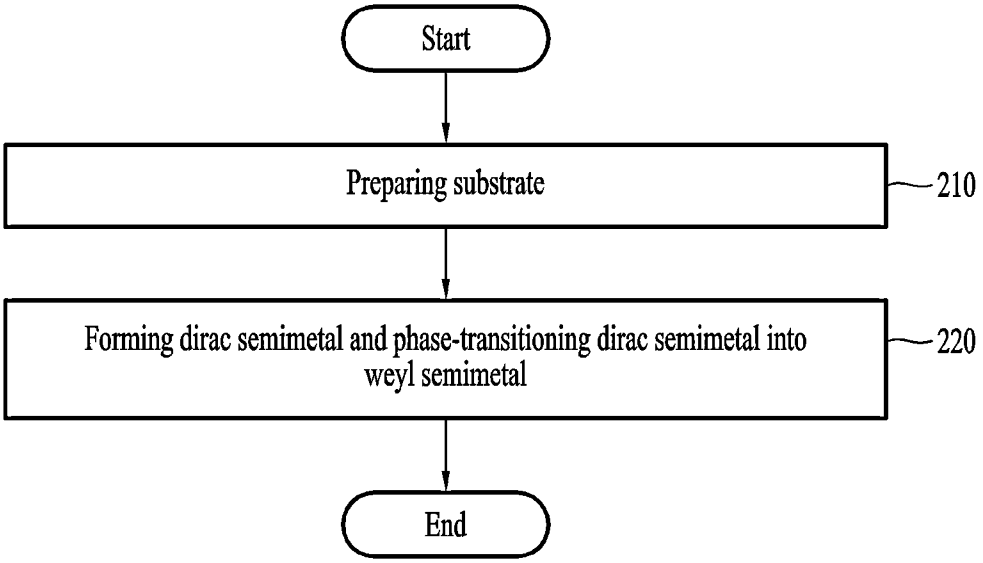

[FIG. 3]
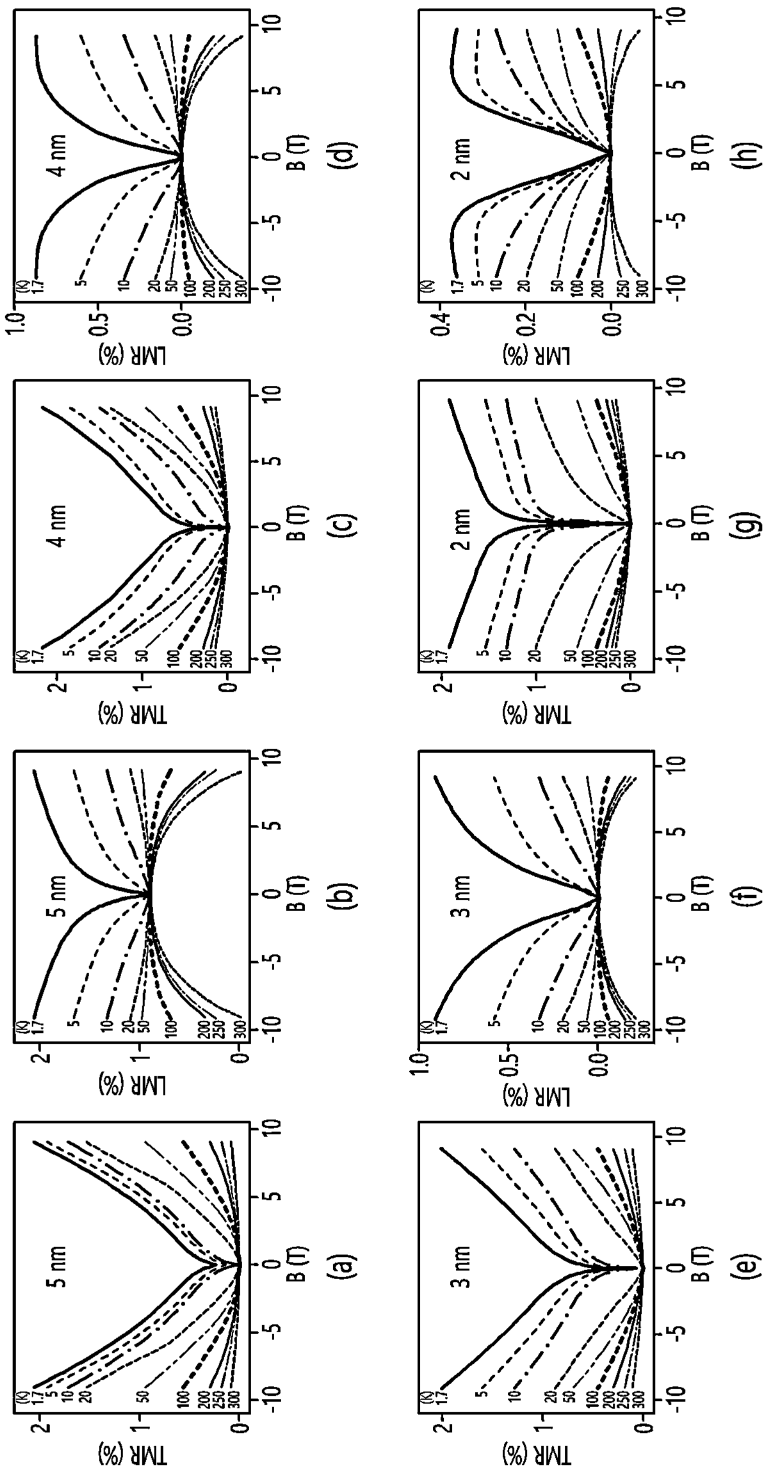

【FIG. 4A】
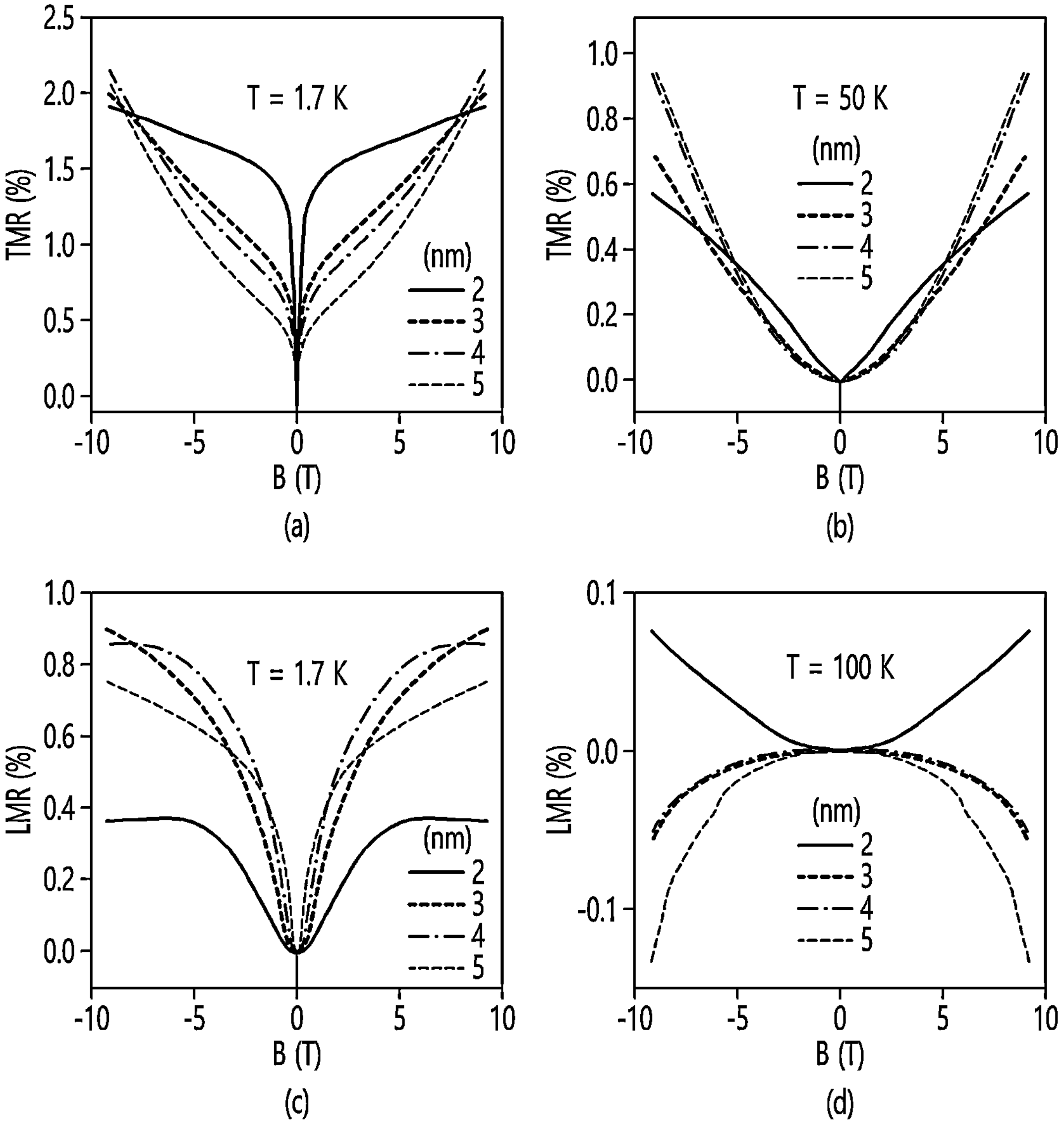

[FIG. 4B]
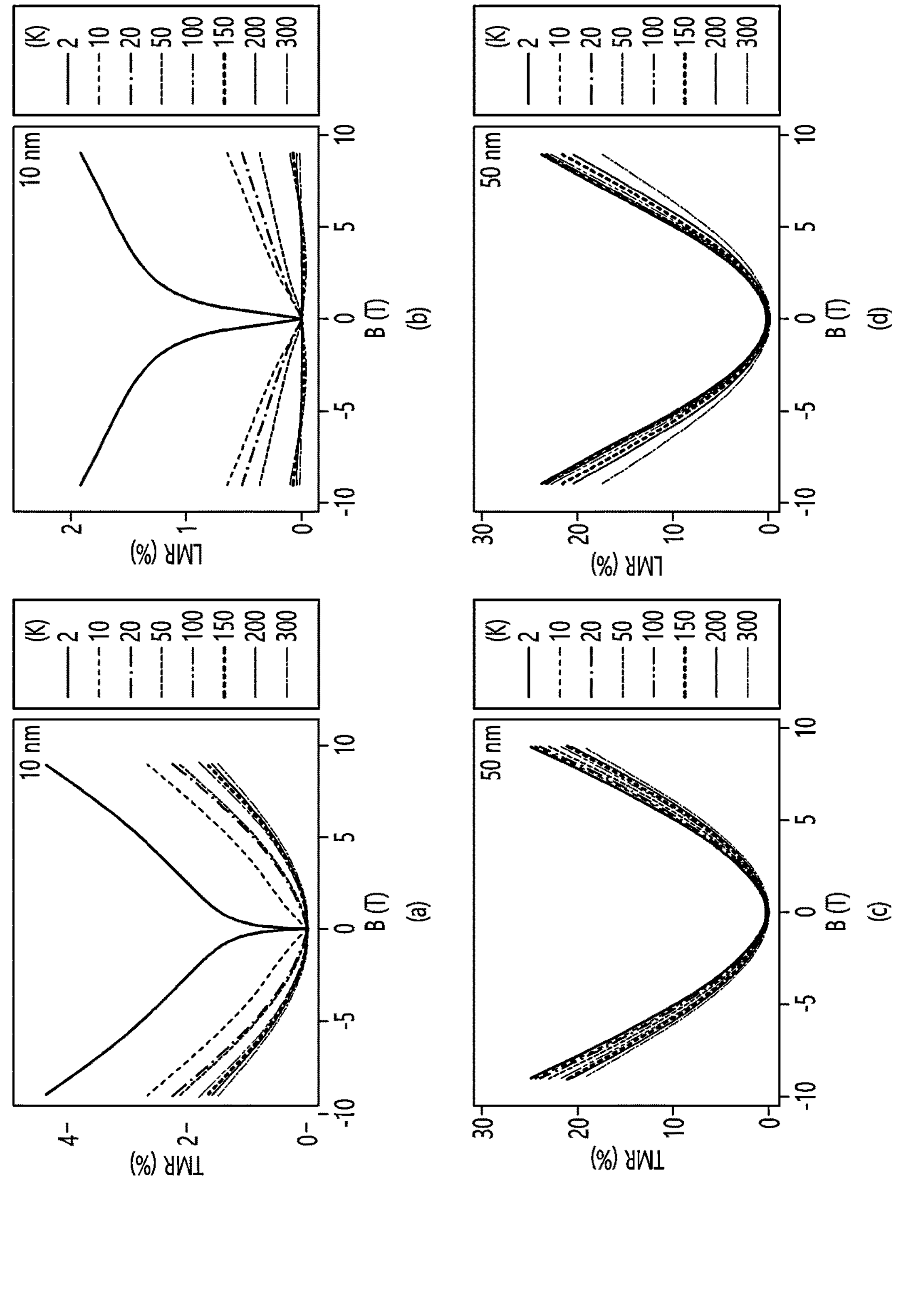

[FIG. 4C]
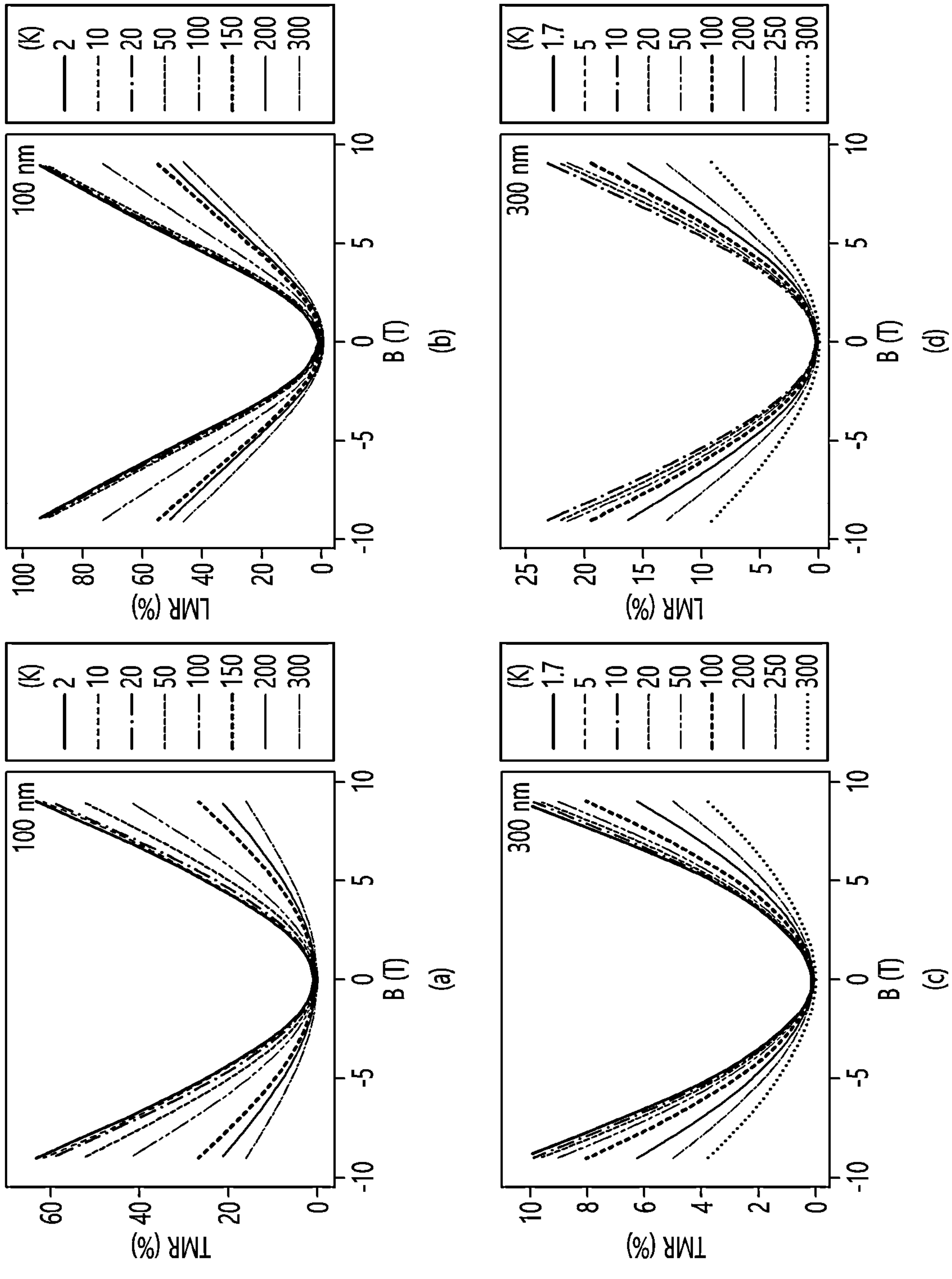

[FIG. 4D]
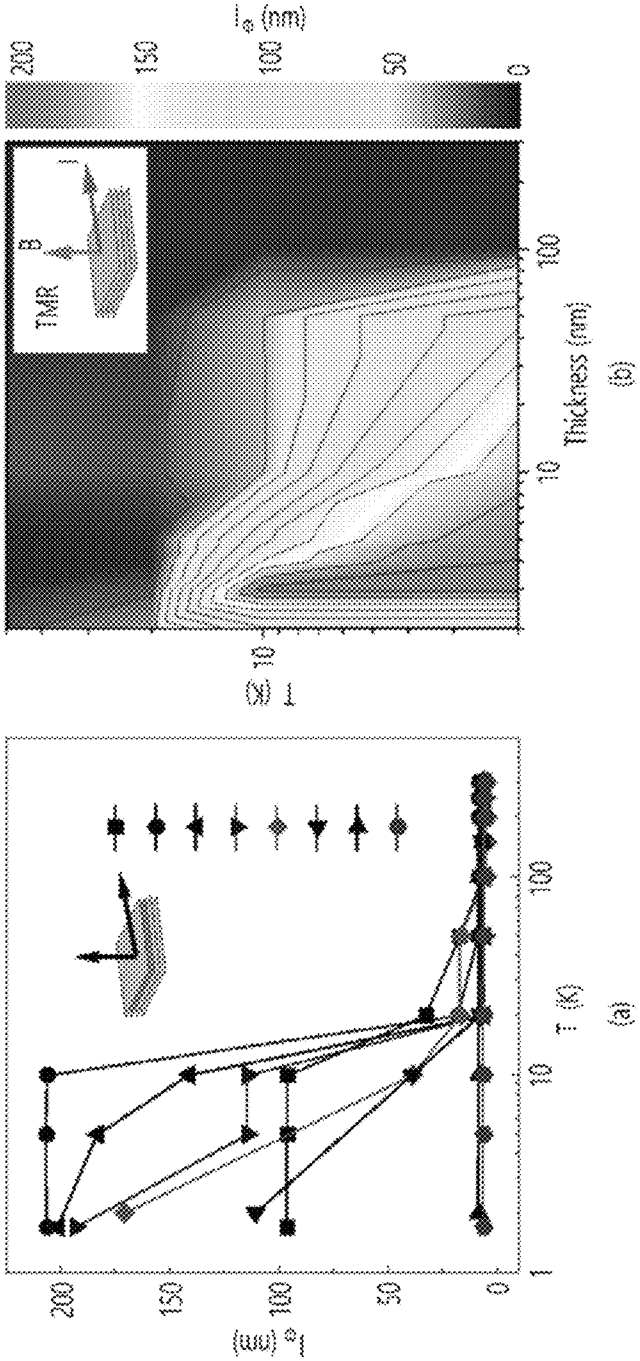

[FIG. 5]
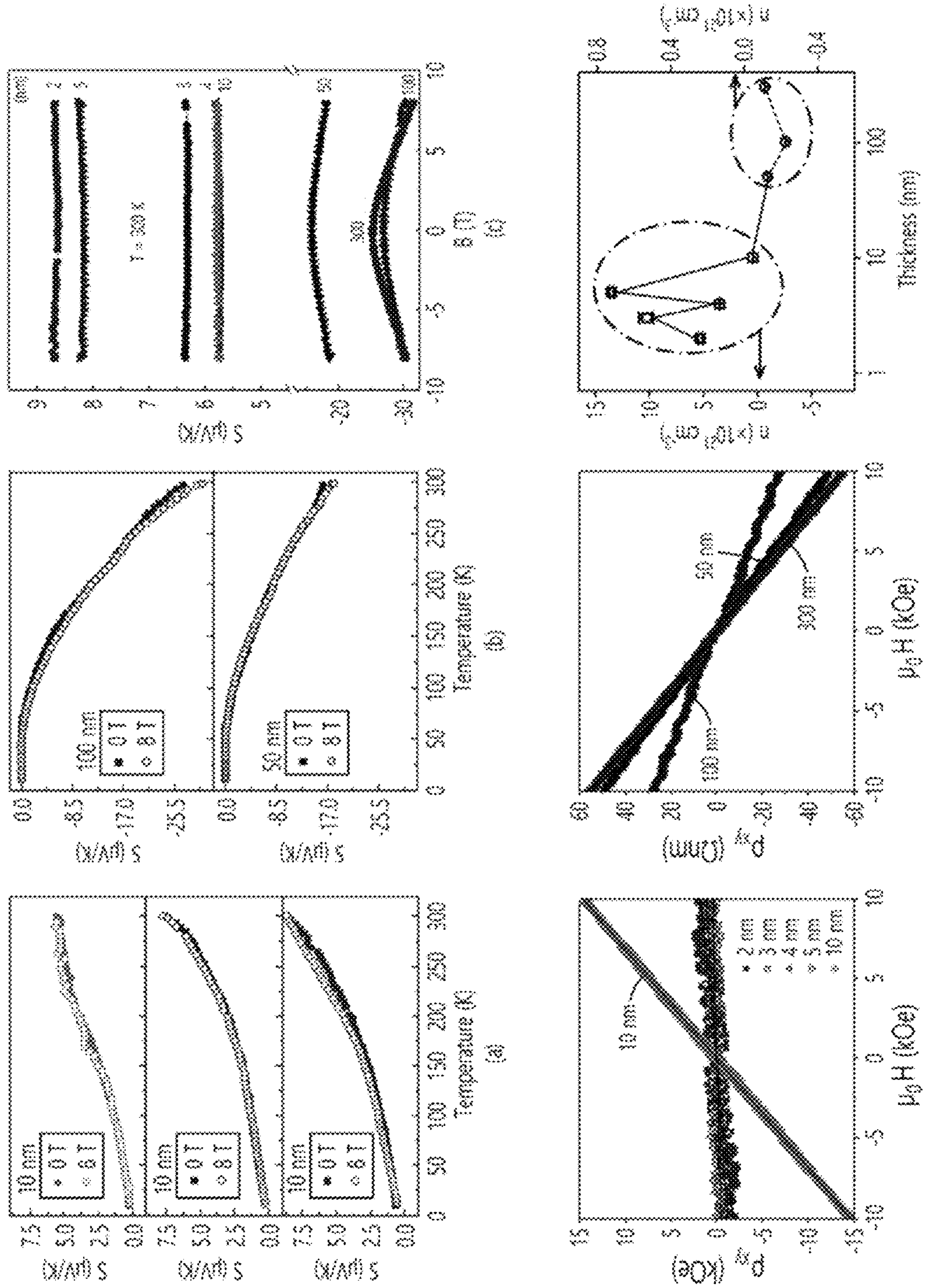

[FIG. 6A]
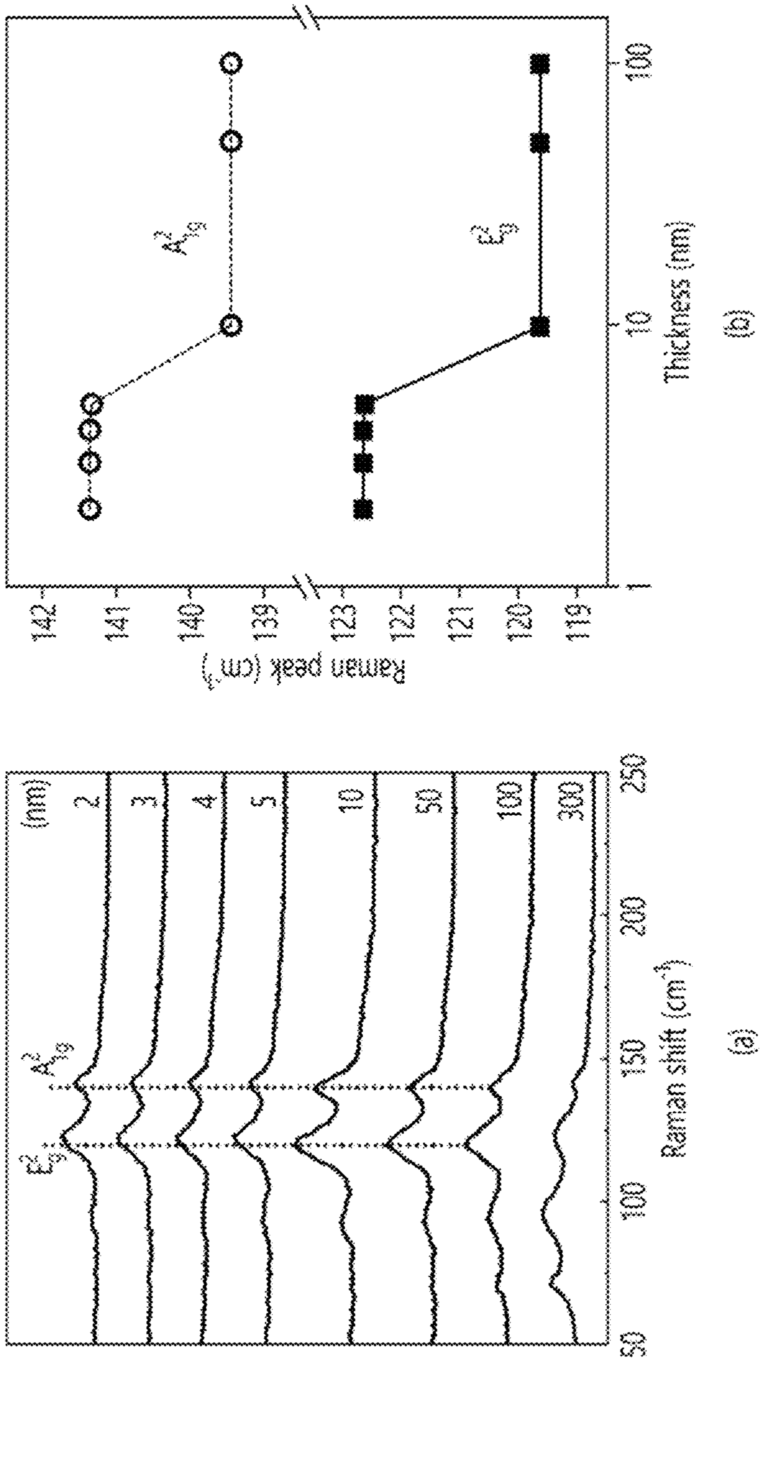

[FIG. 6B]
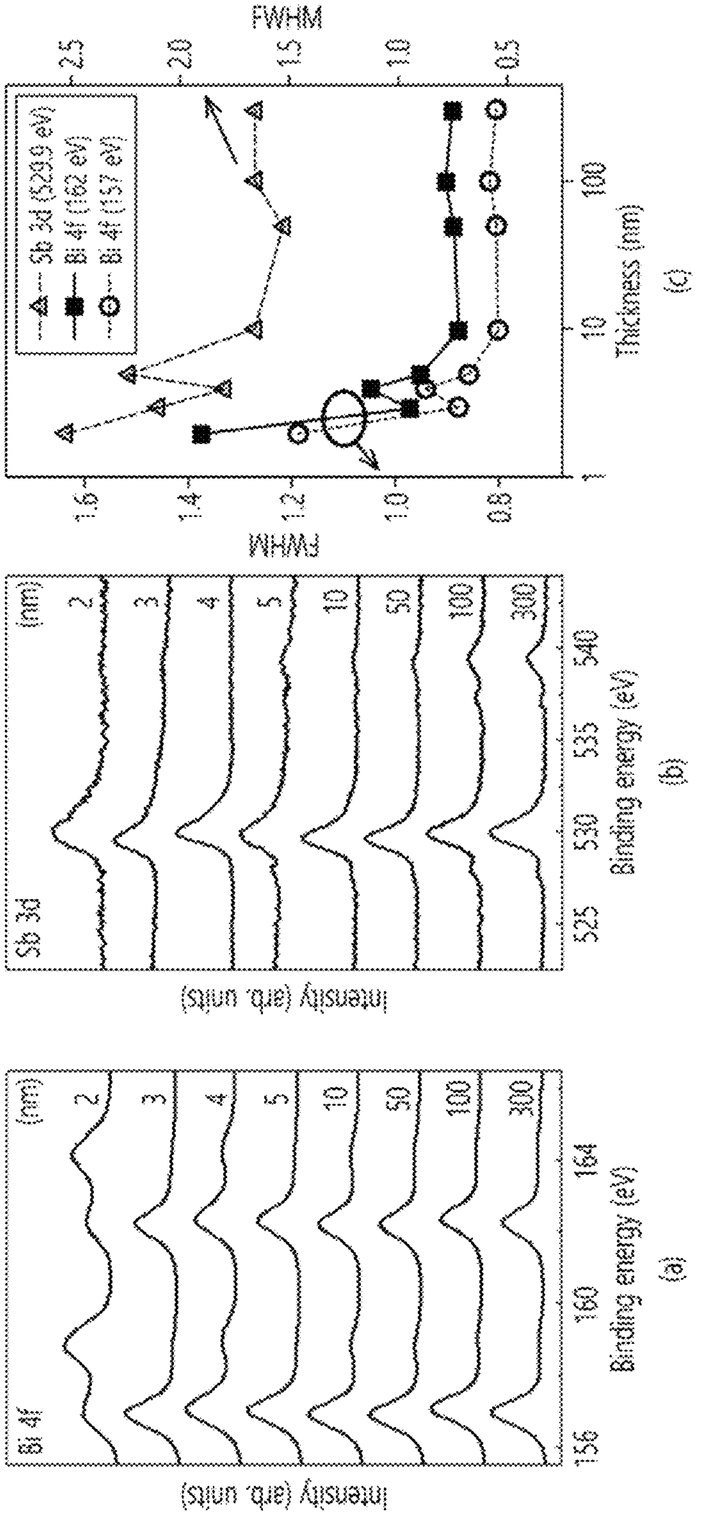

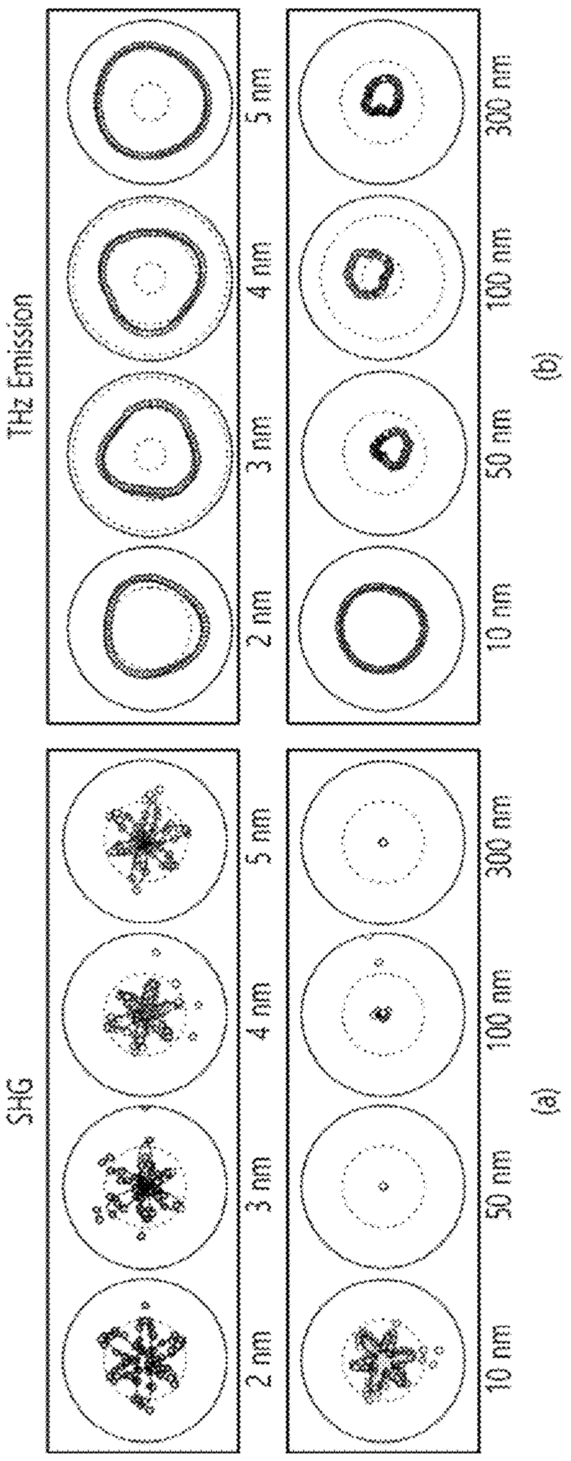
[FIG. 7]

METHOD OF PHASE-TRANSITIONING THREE-DIMENSIONAL DIRAC SEMIMETAL INTO TWO-DIMENSIONAL WEYL SEMIMETAL AND SEMIMETAL THAT UNDERGOES PHASE TRANSITION BY THE SAME

CROSS-REFERENCE TO RELATED APPLICATION

This application claims priority to Korean Patent Application No. 10-2023-0067711, filed on May 25, 2023, and Korean Patent Application No. 10-2023-0169525, filed on Nov. 29, 2023, in the Korean Intellectual Property Office, the disclosure of which is incorporated herein by reference.

BACKGROUND OF THE DISCLOSURE

Field of the Disclosure

The present disclosure relates to a method of phase-transitioning a semimetal, and more particularly, to a technical idea of phase-transitioning a three-dimensional Dirac semimetal into a two-dimensional Weyl semimetal.

Description of the Related Art

Currently, research on topological semimetals (TSMs) such as Dirac semimetals (DSMs), Weyl semimetals (WSMs), nodal-line semimetals, and triple-point semimetals is underway.

In particular, studies are being conducted on the phase transition from a Dirac semimetal to a Weyl semimetal under the conditions of low temperatures or strong magnetic fields, but these studies show limitations in terms of stability in the phase transition.

RELATED ART DOCUMENTS

Patent Documents

Korean Patent No. 10-2364726, "METHOD OF PERMANENTLY PHASE-CHANGING SEMIMETAL THROUGH ION IMPLANTATION AND SEMIMETAL THAT UNDERGOES PHASE TRANSITION BY THE SAME"

SUMMARY OF THE DISCLOSURE

Therefore, the present disclosure has been made in view of the above problems, and it is an object of the present disclosure to provide a technique for phase-transitioning a Dirac semimetal into a Weyl semimetal considering the thickness-dependent characteristics of the Dirac semimetal.

It is another object of the present disclosure to provide a technique for stably phase-transitioning a Dirac semimetal into a Weyl semimetal by optimizing the thickness of the Dirac semimetal.

In accordance with one aspect of the present disclosure, provided is a Dirac semimetal, wherein a phase transition from the Dirac semimetal to a Weyl semimetal (WSM) is induced, wherein the Dirac semimetal is any one semimetal of a bismuth-antimony-based semimetal, a sodium-bismuth-based semimetal, and a cadmium-arsenic-based semimetal, and is formed on a substrate to have a thickness of 2 nm to 10 nm so that a phase transition to the Weyl semimetal is induced.

According to one aspect, the bismuth-antimony-based semimetal may be a semimetal represented by Chemical Formula 1 below.

$Bi_{1-x}Sb_x$, [Chemical Formula 1]

wherein x is a positive real number satisfying $0<x<1$.

According to one aspect, the Dirac semimetal may be formed on the substrate to have a thickness of 2 nm to 10 nm through molecular beam epitaxy.

According to one aspect, the substrate may be a gallium arsenic (GaAs) substrate.

In accordance with another aspect of the present disclosure, provided is a method of phase-transitioning a Dirac semimetal, the method including preparing a substrate; and forming a Dirac semimetal (DSM) on the substrate to have a thickness of 2 nm to 10 nm so that a phase transition from the Dirac semimetal to a Weyl semimetal (WSM) is induced, wherein the Dirac semimetal is any one semimetal of a bismuth-antimony-based semimetal, a sodium-bismuth-based semimetal, and a cadmium-arsenic-based semimetal.

According to one aspect, the bismuth-antimony-based semimetal may be a semimetal represented by Chemical Formula 1.

According to one aspect, in the inducing of a phase transition, the Dirac semimetal may be formed to have a thickness of 2 nm to 10 nm through molecular beam epitaxy.

According to one aspect, the preparing of a substrate may further include cleaning the substrate; and forming a cadmium telluride (CdTe) buffer layer on the cleaned substrate by annealing a mixture of cadmium element (Cd) and tellurium element (Te) at a temperature of 250 °C to 350 °C, and the inducing of a phase transition may include forming the Dirac semimetal having a thickness of 2 nm to 10 nm on the cadmium telluride (CdTe) buffer layer by annealing a mixture of bismuth element (Bi) and antimony element (Sb) at a temperature of 250 °C to 350 °C.

According to one aspect, the inducing of a phase transition may further include forming a cadmium telluride (CdTe) capping layer on the Dirac semimetal by annealing the mixture of cadmium element (Cd) and tellurium element (Te) at a temperature of 250 °C to 350 °C.

According to one aspect, the substrate may be a gallium arsenic (GaAs) substrate.

BRIEF DESCRIPTION OF THE DRAWINGS

The above and other objects, features and other advantages of the present disclosure will be more clearly understood from the following detailed description taken in conjunction with the accompanying drawings, in which:

FIGS. 1A and 1B are diagrams for explaining a Dirac semimetal according to one embodiment;

FIG. 2 is a flowchart for explaining a method of phase-transitioning a Dirac semimetal according to one embodiment;

FIGS. 3 to 4D are diagrams for explaining the TMR characteristics and LMR characteristics of a Dirac semimetal according to one embodiment;

FIG. 5 includes graphs for explaining the Seebeck effect and Hall effect of a Dirac semimetal according to one embodiment;

FIGS. 6A and 6B are graphs for explaining the epitaxial strain effect of a Dirac semimetal according to one embodiment; and FIG. 7 includes diagrams for explaining the inversion symmetry-breaking phenomenon due to SHG and THz emission for a Dirac semimetal according to one embodiment.

DETAILED DESCRIPTION OF THE DISCLOSURE

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as “first” and “second” are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present disclosure.

It should be understood that when an element is referred to as being “connected to” or “coupled to” another element, the element may be directly connected or coupled to the other element or intervening elements may be present. In contrast, when an element is referred to as being “directly connected to” or “directly coupled to” another element, there are no intervening elements present. Other words used to describe the relationship between elements or layers should be interpreted in a like fashion (e.g., “between,” versus “directly between,” “adjacent,” versus “directly adjacent,” etc.).

The terms used in the present specification are used to explain a specific exemplary embodiment and not to limit the present inventive concept. Thus, the expression of singularity in the present specification includes the expression of plurality unless clearly specified otherwise in context. Also, terms such as “include” or “comprise” should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings. However, the scope of the present disclosure is not limited by these embodiments. Like reference numerals in the drawings denote like elements.

FIGS. 1A and 1B are diagrams for explaining a Dirac semimetal according to one embodiment.

Referring to FIGS. 1A and 1B, considering the thickness-dependent characteristics of a Dirac semimetal 130 according to one embodiment, the Dirac semimetal 130 may undergo a phase transition into a Weyl semimetal.

In addition, in the Dirac semimetal 130 according to one embodiment, the thickness is optimally controlled, and a phase transition to a Weyl semimetal may be induced more stably.

Specifically, the Dirac semimetal 130 may be any one semimetal of a bismuth-antimony-based semimetal 130-1, a sodium-bismuth-based semimetal (e.g., $Na_3Bi$ semimetal), and a cadmium-arsenic-based semimetal (e.g., $Cd_3As_2$ semimetal), preferably the bismuth-antimony-based semimetal 130-1.

In addition, the Dirac semimetal 130 may be formed on a substrate to have a thickness of 2 nm to 10 nm, and a phase transition to the Weyl semimetal may be induced.

That is, the Dirac semimetal 130 may be formed on a substrate to have a thickness of 10 nm or less and may be phase-transitioned into the Weyl semimetal. The thickness-dependent characteristics of the Dirac semimetal 130 may be confirmed through the experimental results of FIGS. 3 to 7 below.

According to one aspect, the bismuth-antimony-based semimetal 130-1 may be a semimetal represented by Chemical Formula 1 below.

$$Bi_{1-x}Sb_x \quad \text{[Chemical Formula 1]}$$

Here, x may be a positive real number satisfying $0<x<1$. Preferably, the Dirac semimetal may be a $Bi_{0.96}Sb_{0.04}$ thin film having a thickness of 2 nm to 10 nm.

That is, the Dirac semimetal 130 may be a bismuth-antimony-based Dirac semimetal ($Bi_{1-x}Sb_x$). The crystal structure of the Dirac semimetal 130 may be rhombohedral, and two atoms in each unit $R\bar{3}m$ cell may have a symmetric structure.

Specifically, the fermions of the Dirac semimetal 130 according to one embodiment may have a three-dimensional structure corresponding to the two-dimensional Dirac of graphene. In addition, unlike the Dirac cone of graphene, the Dirac semimetal may have linear energy-momentum dispersion along all three directions (binary, bisectric, and trigonal).

In addition, Dirac semimetal crystals may require time reversal symmetry and inversion symmetry to prevent a Dirac node from splitting into two Weyl nodes.

In addition, during the transition from a topological insulator to a normal insulator, the touching points of a conduction band and a valence band at a critical point may be 3D Dirac points or Weyl points depending on the presence of inversion symmetry.

In addition, Berry curvature, which is a value that characterizes the topological entanglement between a conduction band and a valence band, may be a singularity at Weyl points that act as monopoles in a momentum space with fixed chirality.

According to one aspect, a substrate 110 may be a gallium arsenic (GaAs) substrate. The Dirac semimetal 130 may be formed to have a thickness of 2 nm to 10 nm on the substrate 110 through molecular beam epitaxy.

In addition, a cadmium telluride (CdTe) buffer layer 120 may be formed on the upper portion of the substrate 110, and the Dirac semimetal 130 may be formed on the upper portion of the cadmium telluride (CdTe) buffer layer 120.

In addition, to prevent oxidation of the Dirac semimetal 130, a cadmium telluride (CdTe) capping layer 140 may be formed on the upper portion of the Dirac semimetal 130.

The Dirac semimetal 130 according to one embodiment will be described in more detail with reference to FIG. 2.

FIG. 2 is a flowchart for explaining a method of phase-transitioning a Dirac semimetal according to one embodiment.

Referring to FIG. 2, according to the phase transition method according to one embodiment, in step 210, a substrate may be prepared.

According to one aspect, according to the phase transition method according to one embodiment, in step 210, after cleaning the substrate, a mixture of cadmium element (Cd) and tellurium element (Te) may be annealed at a temperature of 250 °C to 350 °C to form a cadmium telluride (CdTe) buffer layer on the cleaned substrate. Here, the substrate may be a gallium arsenic (GaAs) substrate.

Specifically, according to the phase transition method according to one embodiment, in step 210, the gallium arsenic (GaAs) substrate may be cleaned with methanol for 10 minutes, and then the cleaned substrate may be etched in a diluted HF acid solution (HF:DI water=1:20) for 1 minute to remove a native oxidized layer.

Next, according to the phase transition method according to one embodiment, in step 210, the substrate from which the native oxidized layer has been removed may be heated to 580 °C while being exposed to Te flux in ultra-high vacuum for 30 minutes. Through this process, impurities and oxides remaining on the substrate may be removed.

Next, according to the phase transition method according to one embodiment, in step 210, for the growth of a Dirac semimetal ($Bi_{1-x}Sb_x$ thin film), a cadmium telluride (CdTe) buffer layer may be grown, at a temperature of 320 °C, on the substrate from which residual impurities and oxides have been removed, and then the substrate may be cooled to 150 °C.

According to the phase transition method according to one embodiment, in step 220, by forming the Dirac semimetal (DSM) having a thickness of 2 nm to 10 nm on the substrate, a phase transition from the Dirac semimetal to a Weyl semimetal (WSM) may be induced. Here, the Dirac semimetal may be any one semimetal of a bismuth-antimony-based semimetal, a sodium-bismuth-based semimetal (e.g., $Na_3Bi$ semimetal), and a cadmium-arsenic-based semimetal (e.g., $Cd_3As_2$ semimetal).

Preferably, the Dirac semimetal is the bismuth-antimony-based semimetal ($Bi_{1-x}Sb_x$ thin film) represented by Chemical Formula 1, and may be formed on the substrate to have an optimized thickness (2 nm to 10 nm).

According to one aspect, according to the phase transition method according to one embodiment, in step 220, the Dirac semimetal may be formed to have a thickness of 2 nm to 10 nm through molecular beam epitaxy.

Specifically, according to the phase transition method according to one embodiment, in step 220, based on molecular beam epitaxy, a mixture of bismuth element (Bi) and antimony element (Sb) may be annealed at a temperature of 250 °C to 350 °C to form the Dirac semimetal having a thickness of 2 nm to 10 nm on a cadmium telluride (CdTe) buffer layer.

In addition, according to the phase transition method according to one embodiment, in step 220, a mixture of cadmium element (Cd) and tellurium element (Te) may be annealed at a temperature of 250 °C to 350 °C to form a cadmium telluride (CdTe) capping layer on the Dirac semimetal.

Preferably, according to the phase transition method according to one embodiment, in step 220, a Dirac semimetal (e.g., $Bi_{1-x}Sb_x$ thin film) having a thickness of 2 nm to 10 nm may be grown on the cadmium telluride (CdTe) buffer layer at a temperature of 320 °C.

In addition, according to the phase transition method according to one embodiment, in step 210, a cadmium telluride (CdTe) capping layer having a thickness of 2 nm may be grown on the Dirac semimetal at a temperature of 320 °C.

FIGS. 3 to 4D are diagrams for explaining the TMR characteristics and LMR characteristics of a Dirac semimetal according to one embodiment.

Referring to FIGS. 3 to 4D, graphs (a) and (b) of FIG. 3 show TMR characteristics and LMR characteristics according to changes in temperature (T) and magnetic field (B) for a 5 nm thick Dirac semimetal (specifically, $Bi_{0.96}Sb_{0.04}$ thin film) that has undergone a phase transition to a Weyl semimetal, respectively. Graphs (c) and (d) of FIG. 3 show TMR characteristics and LMR characteristics according to changes in temperature (T) and magnetic field (B) for a 4 nm thick Dirac semimetal that has undergone a phase transition to a Weyl semimetal, respectively.

In addition, graphs (e) and (f) of FIG. 3 show TMR characteristics and LMR characteristics according to changes in temperature (T) and magnetic field (B) for a 3 nm thick Dirac semimetal that has undergone a phase transition to a Weyl semimetal, respectively. Graphs (g) and (h) of FIG. 3 show TMR characteristics and LMR characteristics according to changes in temperature (T) and magnetic field (B) for a 2 nm thick Dirac semimetal that has undergone a phase transition to a Weyl semimetal, respectively.

Graphs (a) and (b) of FIG. 4A show the TMR characteristics of Dirac semimetals having different thicknesses (2 nm to 5 nm) that have undergone a phase transition to a Weyl semimetal when the temperature (T) is 1.7 K and 50 K, respectively. Graphs (c) and (d) of FIG. 4A show the LMR characteristics of Dirac semimetals having different thicknesses (2 nm to 5 nm) that have undergone a phase transition to a Weyl semimetal when the temperature (T) is 1.7 K and 100 K, respectively.

In addition, graphs (a) and (b) of FIG. 4B show TMR characteristics and LMR characteristics at different temperatures (2 K to 300 K) for a Dirac semimetal having a thickness of 10 nm that has undergone a phase transition to a Weyl semimetal, respectively. Graphs (c) and (d) of FIG. 4B show TMR characteristics and LMR characteristics at different temperatures (2 K to 300 K) for a Dirac semimetal having a thickness of 50 nm that has undergone a phase transition to a Weyl semimetal, respectively.

In addition, graphs (a) and (b) of FIG. 4C show TMR characteristics and LMR characteristics at different temperatures (2 K to 300 K) for a Dirac semimetal having a thickness of 100 nm that has undergone a phase transition to a Weyl semimetal, respectively. Graphs (c) and (d) of FIG. 4C show TMR characteristics and LMR characteristics at different temperatures (2 K to 300 K) for a Dirac semimetal having a thickness of 300 nm that has undergone a phase transition to a Weyl semimetal, respectively.

In addition, graphs (a) and (b) of FIG. 4D show the dephasing length (14) results derived using the 2D Hikami-Larkin-Nagaoka (HLN) and HLN formula for Dirac semimetals having different thicknesses (2 nm to 300 nm) that have undergone a phase transition to a Weyl semimetal, respectively.

Here, transverse MR (TMR) and longitudinal MR (LMR) refer to the relative directions of the magnetic field (B) field versus the electric field (E) field in the crystals of a Dirac semimetal that has undergone a phase transition to a Weyl semimetal. Specifically, TMR means a state in which the directions of the magnetic field (B) field and the electric field (E) field are perpendicular (i.e., $B^{\perp}E$), and LMR means a state in which the directions of the magnetic field (B) field and the electric field (E) field are parallel (i.e., B//E).

As shown in graphs (a) to (h) of FIG. 3, the Dirac semimetal according to one embodiment that has undergone a phase transition to a Weyl semimetal exhibits sharp cusps around a magnetic field (B) of 0. As the temperature increases, the sharp cusps gradually become weaker. These results are analyzed to be due to weak anti-localization (WAL), which is a quantum interference (QI) phenomenon.

The behavior of the TMR of the Dirac semimetal according to one embodiment contrasts with that of the LMR in that the LMR decreases as the magnetic field (B) increases at higher temperatures. This phenomenon means negative LMR. Here, NMR is known to result from various mechanisms, including chiral anomaly, which may be distinguished by temperature dependence.

In addition, the WAL characteristics of the Dirac semimetal according to one embodiment appear stronger as the thickness decreases, and the critical temperature for observation increases to at least 50 K when the thickness is 2 nm. These characteristics are shown in both TMR and LMR.

As shown in FIGS. 4A to 4C, NMR is observed in a longitudinal configuration at temperatures (T) above 100 K, and the magnitude thereof increases with the thickness of the Dirac semimetal.

Specifically, for temperatures (T) above 250 K, only NMR is observed for all thicknesses and, crucially, these unique temperature (T)- and thickness (d)-dependent MR properties are observed only in a thin layer having a thickness (d) of 5 nm.

In particular, when the Dirac semimetal is formed as a thick layer of 50 nm to 300 nm, regardless of temperature (T) and thickness (d), only positive TMR and positive LMR are shown without any peaks over the entire range of the magnetic field (B).

In addition, when the thickness of the Dirac semimetal is 10 nm, since peak structures appear for TMR and LMR at temperatures of 10 K and 50 K, respectively, intermediate characteristics between thin layers having a thickness of less than 10 nm and thicker layers having a thickness of 50 nm to 300 nm are shown. At other temperatures, properties similar to those of thick layers are observed.

Referring to FIG. 4D, in the Dirac semimetal, WAL is observed in 2D layers when the dephasing length ($l\phi$) is greater than the thickness. However, at temperatures higher than 10 K, WAL decreases and disappears.

Specifically, the dephasing length ($l\phi$) is observed to suddenly decrease with increasing temperature (T), regardless of the thickness (d). This behavior appears more strongly at relatively thin thicknesses, except when the temperature (T) is less than 10 K and the thickness is 2 nm.

More specifically, the analysis results of the thickness- and temperature-dependent behavior and dephasing length of the MR described above show that the Dirac semimetal according to one embodiment (specifically, $Bi_{0.96}Sb_{0.04}$ thin film) having a thickness of 10 nm or less is in the 2D or quasi-2D localization region. On the other hand, the Dirac semimetal having a thickness of 50 nm or more means that the Dirac semimetal is in the 3D region.

FIG. 5 includes graphs for explaining the Seebeck effect and Hall effect of a Dirac semimetal according to one embodiment.

Referring to FIG. 5, graphs (a) and (b) of FIG. 5 show the measurement results of Seebeck coefficients(S) according to temperature changes for the Dirac semimetals (specifically, $Bi_{0.96}Sb_{0.04}$ thin film) having different thicknesses (2 nm to 100 nm) that have undergone a phase transition to a Weyl semimetal, and graph (c) of FIG. 5 shows the measurement results of Seebeck coefficients(S) at a temperature of 300 K for the Dirac semimetals having different thicknesses (2 nm to 100 nm) that have undergone a phase transition to a Weyl semimetal.

In addition, graphs (d) to (f) of FIG. 5 shows the measurement results of Hall resistivity (ρyx) at a temperature of 4 K for the Dirac semimetals having different thicknesses (2 nm to 300 nm) that have undergone a phase transition to a Weyl semimetal.

As shown in graphs (a) to (c) of FIG. 5, when the Dirac semimetal according to one embodiment has a thickness of 10 nm or less, as the temperature (T) increases, the Seebeck coefficient (S) is a positive value and increases. When the Dirac semimetal according to one embodiment has a thickness of 50 nm or more, as the temperature (T) increases, the Seebeck coefficient (S) is a negative value and the absolute value thereof increases. That is, when the Dirac semimetal has a thickness of 10 nm or less, the Seebeck coefficient (S) is similar to p-type. When the Dirac semimetal has a thickness of 50 nm or more, the Seebeck coefficient (S) is similar to n-type.

That is, in the Dirac semimetal according to one embodiment, it is analyzed that the Seebeck coefficient (S) at a temperature of 300 K and a predetermined magnetic field (B) field (here, 8T) is very strongly influenced by the thickness characteristics of the Dirac semimetal.

Specifically, when the thickness of the Dirac semimetal is 50 nm to 300 nm, the Seebeck coefficient (S) decreases. When the Dirac semimetal is very thin, i.e., the Dirac semimetal has a thickness of 2 nm to 3 nm, the Seebeck coefficient (S) increases. In particular, the influence of the magnetic field (B) field on the Seebeck coefficient (S) appears strong when the thickness of the Dirac semimetal is 50 nm or more, but appears weak when the thickness of the Dirac semimetal is 10 nm or less.

As shown in graphs (d) to (f) of FIG. 5, according to the measurement results of Hall resistivity (ρyx), it can be confirmed that at a thickness of 10 nm or less, the transition from p-type to n-type is clearly observed in the Dirac semimetal according to one embodiment.

FIGS. 6A and 6B are graphs for explaining the epitaxial strain effect of a Dirac semimetal according to one embodiment.

Graph (a) of FIG. 6A shows the measurement results of Raman spectra for the Dirac semimetals having different thicknesses (2 nm to 300 nm) that have undergone a phase transition to a Weyl semimetal, and graph (b) of FIG. 6A shows the measurement results of Raman peaks for the Dirac semimetals having different thicknesses (2 nm to 300 nm) that have undergone a phase transition to a Weyl semimetal.

Graphs (a) and (b) of FIG. 6B show the measurement results of XPS spectra at the core level of Bi 4f and Sb 3d atoms for the Dirac semimetals having different thicknesses (2 nm to 300 nm) that have undergone a phase transition to a Weyl semimetal. Graph (c) of FIG. 6 shows the measurement results of the FWHM (full width at half maximum) of the XPS peak for the Dirac semimetals having different thicknesses (2 nm to 300 nm) that have undergone a phase transition to a Weyl semimetal.

As shown in FIGS. 6A and 6B, it can be seen that four Raman peaks are observed in a Dirac semimetal having a thickness of 300 nm, but the Dirac semimetal is not well resolved. This phenomenon is analyzed to be caused by epitaxial strain that causes IS breaking during the phase transition from a Dirac semimetal to a Weyl semimetal.

In addition, all XPS peaks are analyzed to show a sharp increase in FWHM for a Dirac semimetal having a thickness of 10 nm or less.

FIG. 7 includes diagrams for explaining the inversion symmetry-breaking phenomenon due to SHG and THz emission for a Dirac semimetal according to one embodiment.

Referring to FIG. 7, diagram (a) of FIG. 7 shows the analysis results of SHG pattern versus azimuth (Φ) for the Dirac semimetals having different thicknesses (2 nm to 300 nm) that have undergone a phase transition to a Weyl semimetal, and diagram (b) of FIG. 7 shows the analysis results of amplitude versus azimuth (Φ) of linearly polarized THz waves for the Dirac semimetals having different thicknesses (2 nm to 300 nm) that have undergone a phase transition to a Weyl semimetal.

Referring to FIG. 7, it can be confirmed that the SHG pattern for the Dirac semimetal according to one embodiment is clearly divided into two groups (a group having a thickness of 10 nm or less and a group having a thickness of 50 nm or more).

Specifically, diagram (a) of FIG. 7 shows that IS breaking occurred in the group having a thickness of 10 nm or less. This result indicates that a thickness of 10 nm or less is the critical value that induces a phase transition from the Dirac semimetal to the Weyl semimetal.

In addition, the Dirac semimetal according to one embodiment shows that a very large THz pattern appears when the thickness is 10 nm or less. This result indicates that IS breaking occurred when the thickness was 10 nm or less.

According to one embodiment, considering the thickness-dependent characteristics of a Dirac semimetal, the present disclosure can allow for a phase transition from the Dirac semimetal to a Weyl semimetal.

According to one embodiment, the present disclosure can optimize the thickness of the Dirac semimetal and allow for a more stable phase transition from the Dirac semimetal to a Weyl semimetal.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

| [Description of Symbols] | |
|---|---|
| 110: SUBSTRATE | 120: BUFFER LAYER |
| 130: DIRAC SEMIMETAL | 140: CAPPING LAYER |

What is claimed is:

1. A Dirac semimetal, wherein a phase transition from the Dirac semimetal (DSM) to a Weyl semimetal (WSM) is induced, wherein the Dirac semimetal is a bismuth-antimony-based semimetal, and is formed on a cadmium telluride (CdTe) buffer layer that is formed on a substrate, the Dirac semimetal being formed to have a thickness of 2 nm to 10 nm so that a phase transition to the Weyl semimetal is induced, wherein the cadmium telluride (CdTe) buffer layer is formed by annealing a mixture of cadmium (Cd) and tellurium (Te) at a temperature of 250 °C to 350 °C, and wherein the Dirac semimetal is formed on the cadmium telluride (CdTe) buffer layer by annealing a mixture of bismuth (Bi) and antimony (Sb) at a temperature of 250 °C to 350 °C.

2. The Dirac semimetal according to claim 1, wherein the bismuth-antimony-based semimetal is a semimetal represented by Chemical Formula 1 below:

$Bi_{1-x}Sb_x$, [Chemical Formula 1]

wherein x is a positive real number satisfying $0<x<1$.

3. The Dirac semimetal according to claim 1, wherein the Dirac semimetal is formed to have a thickness of 2 nm to 10 nm through molecular beam epitaxy.

4. The Dirac semimetal according to claim 1, wherein the substrate is a gallium arsenic (GaAs) substrate.

5. A method of phase-transitioning a Dirac semimetal, comprising:

preparing a substrate, the preparing of the substrate comprising:

cleaning the substrate; and forming a cadmium telluride (CdTe) buffer layer on the cleaned substrate by annealing a mixture of cadmium element (Cd) and tellurium element (Te) at a temperature of 250 °C to 350 °C; and forming a Dirac semimetal (DSM) on the cadmium telluride (CdTe) buffer layer to have a thickness of 2 nm to 10 nm so that a phase transition from the Dirac semimetal to a Weyl semimetal (WSM) is induced, wherein the Dirac semimetal is a bismuth-antimony-based semimetal, and wherein the inducing of the phase transition comprises forming the Dirac semimetal having a thickness of 2 nm to 10 nm on the cadmium telluride (CdTe) buffer layer by annealing a mixture of bismuth element (Bi) and antimony element (Sb) at a temperature of 250 °C to 350 °C.

6. The method according to claim 5, wherein the bismuth-antimony-based semimetal is a semimetal represented by Chemical Formula 1 below:

$Bi_{1-x}Sb_x$, [Chemical Formula 1]

wherein x is a positive real number satisfying $0<x<1$.

7. The method according to claim 5, wherein, in the inducing of a phase transition, the Dirac semimetal is formed to have a thickness of 2 nm to 10 nm through molecular beam epitaxy.

8. The method according to claim 5, wherein the inducing of the phase transition further comprises forming a cadmium telluride (CdTe) capping layer on the Dirac semimetal by annealing the mixture of cadmium element (Cd) and tellurium element (Te) at a temperature of 250 °C to 350 °C.

9. The method according to claim 6, wherein the substrate is a gallium arsenic (GaAs) substrate.

* * * * *